United States Patent
Zheng et al.

(10) Patent No.: US 9,780,528 B1
(45) Date of Patent: Oct. 3, 2017

(54) FAST WAVELENGTH-TUNABLE HYBRID LASER WITH A SINGLE-CHANNEL GAIN MEDIUM

(71) Applicant: Oracle International Corporation, Redwood Shores, MD (US)

(72) Inventors: Xuezhe Zheng, San Diego, CA (US); Ying Luo, San Diego, CA (US); Daniel Y. Lee, San Diego, CA (US); Ashok V. Krishnamoorthy, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 15/357,418

(22) Filed: Nov. 21, 2016

(51) Int. Cl.
| | |
|---|---|
| H01S 5/00 | (2006.01) |
| H01S 5/10 | (2006.01) |
| H01S 5/125 | (2006.01) |
| H01S 5/068 | (2006.01) |
| H01S 5/02 | (2006.01) |
| H01S 5/50 | (2006.01) |

(52) U.S. Cl.
CPC .......... *H01S 5/1092* (2013.01); *H01S 5/0078* (2013.01); *H01S 5/021* (2013.01); *H01S 5/06804* (2013.01); *H01S 5/1032* (2013.01); *H01S 5/1071* (2013.01); *H01S 5/125* (2013.01); *H01S 5/5045* (2013.01)

(58) Field of Classification Search
CPC .... H01S 5/0078; H01S 5/5054; H01S 5/1092; H01S 5/021; H01S 5/068; H01S 5/06804; H01S 5/1032; H01S 5/1071; H01S 5/125
See application file for complete search history.

(56) References Cited

U.S. PATENT DOCUMENTS

| | | | | |
|---|---|---|---|---|
| 5,343,542 A | * | 8/1994 | Kash | G02B 6/12007 372/45.01 |
| 8,965,208 B2 | * | 2/2015 | Asghari | B82Y 20/00 398/79 |
| 9,118,165 B1 | * | 8/2015 | Norberg | H01S 3/08086 |
| 2002/0172465 A1 | * | 11/2002 | Riza | G02B 6/356 385/47 |
| 2003/0002809 A1 | * | 1/2003 | Jian | G02B 6/423 385/73 |
| 2009/0245801 A1 | * | 10/2009 | Little | G02B 6/12004 398/89 |

* cited by examiner

*Primary Examiner* — Kinam Park
(74) *Attorney, Agent, or Firm* — Park, Vaughan, Fleming & Dowler LLP (57) ABSTRACT

A tunable laser includes a semiconductor optical amplifier (SOA) having a reflective end coupled to a shared reflector and an output end, which is coupled to a demultiplexer through an input waveguide. The demultiplexer comprises a set of Mach-Zehnder (MZ) lattice filters, which function as symmetric de-interleaving wavelength splitters, that are cascaded to form a binary tree that connects an input port, which carries multiple wavelength bands, to N wavelength-specific output ports that are coupled to a set of N reflectors. A set of variable optical attenuators (VOAs) is coupled to outputs of the MZ lattice filters in the binary tree, and is controllable to selectively add loss to the outputs, so that only a single favored wavelength band, which is associated with a favored reflector in the set of N reflectors, lases at any given time. An output waveguide is optically coupled to the lasing cavity.

20 Claims, 6 Drawing Sheets

FAST WAVELENGTH-TUNABLE HYBRID LASER WITH A SINGLE-CHANNEL GAIN MEDIUM

GOVERNMENT LICENSE RIGHTS

This invention was made with U.S. government support under Agreement No. HR0011-08-9-0001 awarded by DARPA. The U.S. government has certain rights in the invention.

FIELD

The disclosed embodiments generally relate to the design of a semiconductor-based laser. More specifically, the disclosed embodiments relate to the design of a fast wavelength-tunable hybrid semiconductor laser having a single-channel gain medium.

RELATED ART

Silicon photonics is a promising new technology that can potentially provide large communication bandwidth, low latency and low power consumption for inter-chip and intra-chip connections. In order to achieve such low-latency, high-bandwidth optical connectivity, a number of optical components are required, including: optical modulators, optical detectors, wavelength multiplexers, wavelength demultiplexers, optical sources and optical switches.

Energy-efficient and cost-effective optical switches are required to make such optical connections practical in data centers and high-performance, data-intensive computing systems. One promising optical-switching approach is to use the unique wavelength routing capability of arrayed-waveguide-grating-routers (AWGRs) with carrier wavelength switching at the source node. (See K. Kato, et al., "32×32 full-mesh (1024 path) wavelength routing WDM network based on uniform loss cyclic-frequency arrayed-waveguide grating," Electron. Lett., vol. 36, pp. 1294-1295, 2000.) However, to make this approach practical, a laser with fast wavelength tuning is needed to facilitate such source-originated optical switching.

SUMMARY

The disclosed embodiments relate to a system that provides a tunable laser, which includes a gain medium (such as a semiconductor optical amplifier) having a reflective end coupled to a shared reflector and an output end. The gain medium is coupled to a demultiplexer through an input waveguide, wherein the demultiplexer comprises a set of wavelength splitters that are cascaded to form a binary tree that connects an input port, which carries multiple wavelength bands, to N wavelength-specific output ports. The tunable laser also includes: a set of N reflectors coupled to the N output ports of the demultiplexer; and a set of variable optical attenuators (VOAs) coupled to outputs of the wavelength filters in the binary tree, which are controllable to selectively add loss to the outputs. A controller selectively activates the set of VOAs to add loss to unwanted wavelength bands in the demultiplexer, so that only a single favored wavelength band, which is associated with a favored reflector in the set of N reflectors, lases at any given time. Finally, an output waveguide is optically coupled to a lasing cavity formed by the shared reflector, the gain medium, the input waveguide, the demultiplexer and the favored reflector.

In some embodiments, the demultiplexer is a symmetric de-interleaving wavelength splitter.

In some embodiments, the symmetric de-interleaving wavelength splitter is a Mach-Zehnder (MZ)-lattice-based demultiplexer, wherein the wavelength splitters are MZ lattice filters.

In some embodiments, the wavelength-specific narrow-band reflectors comprise: narrow-band waveguide distributed Bragg reflectors (DBRs); ring reflectors; or ring reflectors coupled with loop mirrors.

In some embodiments, the set of N reflectors comprises broadband reflectors, and the input waveguide is optically coupled to the input port of the demultiplexer through an intervening shared ring filter, wherein the shared ring filter has a free spectral range (FSR) that matches a desired wavelength channel spacing.

In some embodiments, broadband reflectors comprise: broadband waveguide DBRs; loop mirrors with Y-junctions; or loop mirrors with directional couplers.

In some embodiments, the shared ring reflector includes: a thermal phase tuner to facilitate an initial alignment with a cavity mode; and an electro-optical (EO) phase tuner to facilitate subsequent fine alignment with the cavity mode.

In some embodiments, the input waveguide includes a thermo-optic coefficient (TOC) compensator comprising a section of compensation material. In these embodiments, the lasing cavity includes a length $l_{Si}$ through silicon, a length $l_C$ through the compensation material, and a length $l_{OGM}$ through the optical gain material, wherein the effective refractive index of silicon is $n_{Si}$, the effective refractive index of the compensation material is $n_C$, and the effective refractive index of the optical gain material is $n_{OGM}$. Moreover, the effective TOC of silicon is $dn_{Si}/dT$, the effective TOC of the compensation material is $dn_C/dT$, and the effective TOC of the optical gain material is $dn_{OGM}/dT$. Finally, $l_C \approx l_{OGM}*(dn_{OGM}/dT - dn_{Si}/dT)/(dn_{Si}/dT - dn_C/dT)$, whereby the effective TOC of a portion of the lasing cavity that passes through the optical gain material and the compensation material is substantially the same as the TOC of silicon.

In some embodiments, the gain medium comprises a reflective semiconductor optical amplifier (RSOA), and the shared reflector comprises a reflective facet of the RSOA.

In some embodiments, the reflective facet of the RSOA is partially reflective, and unreflected light from the reflective facet feeds into the output waveguide.

In some embodiments, the shared reflector comprises a waveguide loop mirror with a first end coupled to the reflective end of the gain medium.

In some embodiments, a second end of the waveguide loop mirror is coupled to the output waveguide.

In some embodiments, the output waveguide is optically coupled to the input waveguide through a directional coupler.

In some embodiments, the gain medium is located on a gain chip, which is separate from a semiconductor chip that includes the input waveguide, the demultiplexer, the set of N reflectors and the set of VOAs.

Throughout this specification and in the appended claims we use the term "gain medium" to refer any device, which contains active gain material and can be used to power a laser. This can include but is not limited to: a semiconductor optical amplifier (SOA); an active device fabricated using a quantum-dot gain material; and an active device fabricated in a nonlinear fiber gain medium. We also a refer to a gain medium having a reflective end coupled to a "shared reflector." The term "shared reflector" can include but is not limited to: a reflective facet coupled to the reflective end of the gain medium, whereby the gain medium comprises a reflective semiconductor optical amplifier (RSOA); a waveguide loop mirror coupled to the reflective end of the gain medium; and a distributed Bragg waveguide (DBR) mirror coupled to the reflective end of the gain medium.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Implementation Details

We have developed a silicon-assisted hybrid laser with fast wavelength tuning that operates by turning "on" and "off" the individual semiconductor optical amplifiers (SOAs) located on the separate III-V gain medium, while maintaining the silicon components of the laser in a static state, or by performing only minimal resonance adjustments. (See U.S. patent application Ser. No. 15/047,090, entitled "Ring-Resonator-Based Laser with Multiple Wavelengths," by inventors Jock T. Bovington, et al., which is incorporated by reference herein.) The disadvantage of this approach is that a multi-channel gain medium is required with channel counts equal to the number of tunable wavelength channels, N. When N is large, the cost of the III-V gain media becomes high, and associated manufacturing-defect rates can create problems. In addition, although the process of turning an SOA "on" and "off" may be high speed, associated current-injection-induced thermal effects can be slow, which can potentially limit the tuning speed.

We also developed a fast-tunable silicon-assisted hybrid laser using a single-channel gain medium, wherein the fast wavelength tuning is achieved by using a fast MEMS switch connected to a set of reflectors, while minimizing required tuning control. (See U.S. patent application Ser. No. 15/341,691, entitled "Scalable Fast Tunable Si-Assisted Hybrid Laser with Redundancy," by inventors Xuezhe Zheng, et al., filed on 2 Nov. 2016, which is incorporated by reference herein.) Unfortunately, the process of integrating the SOI MEMS switch with the other silicon-photonic components has yet to be perfected.

To overcome the drawbacks of the above-described fast-tunable lasers, we have developed a fast-tunable hybrid laser source that uses a single-channel III-V gain medium and a cascaded set of MZI lattice filters. This laser source uses a passive thermo-optic compensator for each channel. Moreover, fast wavelength tuning is achieved by using electro-optic (EO) silicon variable optical attenuators (VOAs). In addition, by attaching a broadband modulator to the laser output, a hybrid optical transmitter can be implemented that provides fast wavelength tuning, and requires only minimal tuning power.

Wavelength tuning in a silicon-assisted hybrid laser is typically achieved by tuning the center wavelength of a silicon filter inside the laser cavity. Due to the weak EO effect of silicon, thermal tuning is commonly used. However, such thermal tuning is usually slow, with time constants on the order of a few microseconds. To achieve fast wavelength tuning, one possible technique is to reduce the required tuning range of the filters so that a faster EO tuner can be used.

Figure 1:
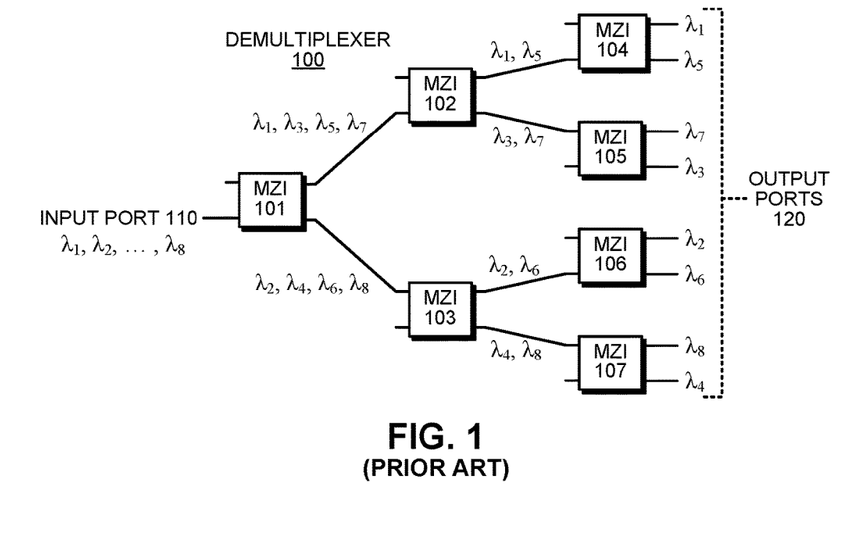
FIG. 1 illustrates a demultiplexer comprising cascaded Mach-Zehnder lattice filters in accordance with the disclosed embodiments.

Fast wavelength switching can be accomplished by using a silicon-based demultiplexer. In particular, a WDM demultiplexer that provides both low loss and flat transmission pass-bands can be produced by using cascaded Mach-Zehnder lattice filters. (For example, see Folkert Host, et al., "Cascaded Mach-Zehnder wavelength filters in silicon photonics for low loss and flat pass-band WDM de-multiplexing," Optics Express, 21(20) 11652-11658, 2013.) FIG. 1 illustrates such a 1×8 demultiplexer 100 constructed using simple four-port Mach-Zehnder-interferometer (MZI) lattice filters 101-107 that serve as symmetric de-interleaving wavelength splitters. By cascading seven of these wavelength splitters in a binary tree as in FIG. 1, an input port 110 with eight wavelength bands $\lambda_1$-$\lambda_8$ can be demultiplexed into a set of dedicated output ports 120 for each wavelength band. The lattice filters 101-107 comprise a lattice of optical waveguides of varying lengths, joined by optical directional couplers. Note that waveguides and directional couplers, apart from scattering loss on the waveguide side walls, are inherently loss-less components, resulting in low-loss devices. Moreover, in lattice filters 101-107, a flat pass-band can be designed into the filter curve by adding extra lattice stages.

Figure 2A:
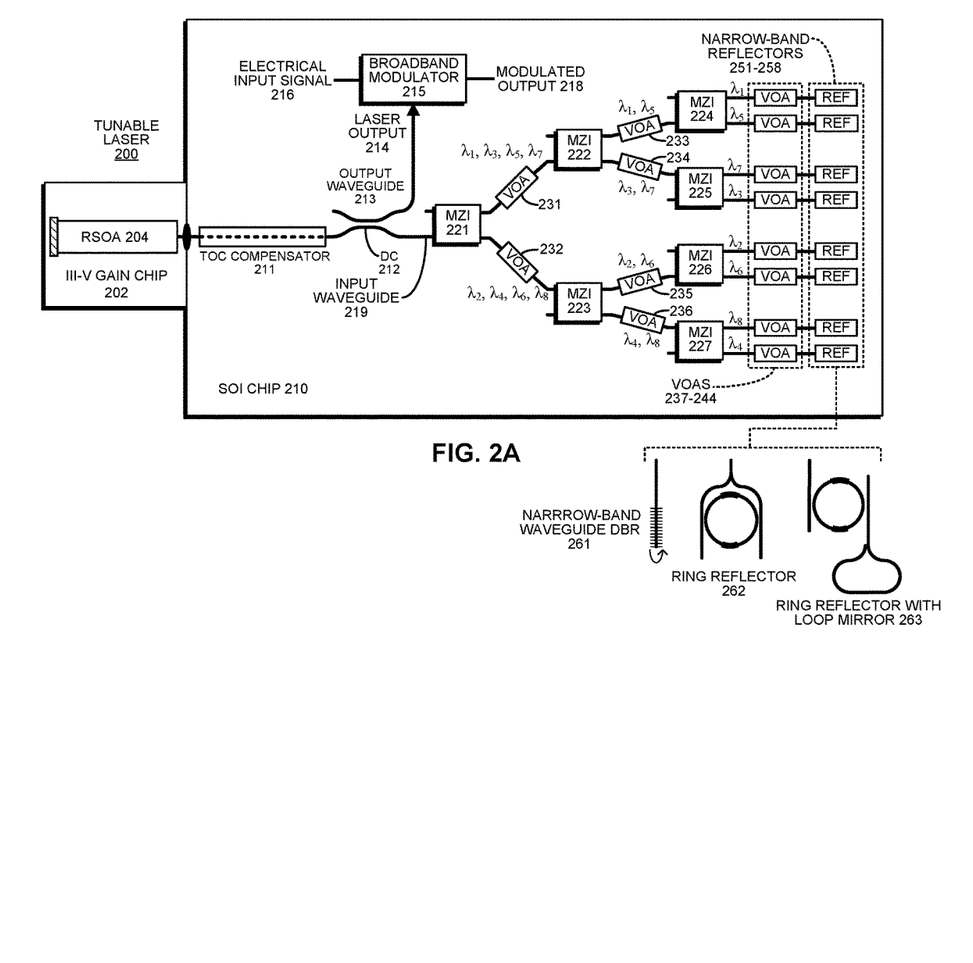
FIG. 2A illustrates a fast wavelength-tunable hybrid laser comprising a single-channel gain medium, a multi-stage lattice filter and wavelength-selective silicon reflectors in accordance with the disclosed embodiments.

The lattice-filter-based WDM demultiplexer 100 illustrated in FIG. 1 can be modified and incorporated into a tunable laser 200 as is illustrated in FIG. 2A. As depicted in FIG. 2A, tunable laser 200 includes a 1×8 demultiplexer comprising MZI lattice filters 221-227, which has been modified by adding silicon variable optical attenuators (VOAs) 231-244 to the outputs of the MZI filters 221-227. Note that each of the VOAs 231-244 can be implemented using a silicon waveguide integrated with a PIN diode. These integrated silicon VOAs 231-244 can be controlled to add additional loss to unwanted channels, so that only one favored wavelength lases at any given time.

The outputs of this modified demultiplexer are connected to a set of narrow-band reflectors 251-258. As illustrated in FIG. 2A, these narrow-band-reflectors 251-258 can be implemented using a number of different structures, including a narrow-band waveguide DBR 261, a ring reflector 262 and a ring reflector with a loop mirror 263.

The input of this modified demultiplexer is connected through an input waveguide 219 to an RSOA 204 located on a separate III-V gain chip 202, which is connected (e.g., via edge or surface-normal coupling) to the SOI chip 210 that includes the other components of tunable laser 200. The HR facet of RSOA 204 and a favored narrow-band reflector from the set of narrow band reflectors 251-258 form a lasing cavity. Moreover, a directional coupler (DC) is used to couple the lasing light to an output waveguide 213 to produce a laser output 214.

Because of the different thermo-optic coefficients (TOCs) of silicon and the III-V gain material, the position of the laser cavity modes will drift at a different rate from those of the narrow band reflectors 251-258 as the ambient temperature changes. This can cause "walk-offs" between the aligned reflector peaks and the laser cavity modes if the ambient temperature changes significantly, which will result in mode-hopping that is potentially fatal in high-speed communication links. This mode-hopping problem can be solved by using an active closed-loop feedback control system. However, this will not prevent drift of the entire array as the ambient temperature changes because each of the wavelength channels in the array will vary with temperature at a rate of approximately 0.08 nm/° C. This drift can potentially create a large tuning-range requirement for each narrow-band reflector.

An elegant solution to remove such drift and eliminate related tuning requirements is to add a simple TOC compensator 211 having a properly selected length to the input waveguide 219, which can effectively eliminate temperature-induced mode-hopping. (See U.S. patent application Ser. No. 15/292,501, entitled "Surface-Normal Optical Coupling Interface with Thermal-Optic Coefficient Conversion," by inventors Ying L. Luo, Xuezhe Zheng and Ashok V. Krishnamoorthy, filed 13 Oct. 2016, which is incorporated by reference herein.)

Note that TOC compensator 211 can be implemented using a SiON waveguide (or another material with a thermo-optic coefficient lower than silicon) with proper low-loss transition to the silicon waveguides. Assume the effective lengths of the three materials Si, SiON and III-V in the hybrid cavity are $L_1$, $L_2$, and $L_3$, their refractive indices are $n_1$, $n_2$, and $n_3$, and their thermo-optic coefficients are $dn_1/dT$, $dn_2/dT$ and $dn_3/dT$, respectively. The changes in optical path length of the cavity mode $\Delta nL$ due to temperature variation $\Delta T$ can be expressed as $$\Delta nL = (dn_1/dT*L_1 + dn_2/dT*L_2 + dn_3/dT*L_3)*\Delta T.$$

We can make the average dn/dT of the hybrid cavity equal to $dn_1/dT$ by choosing $$L_2 = (dn_3/dT - dn_1/dT)/(dn_1/dT - dn_2/dT)*L_3.$$

With this TOC compensator waveguide design, the cavity modes will drift at the same pace as the silicon filter. Once the initial alignment is done, no further active tuning control is needed to keep the hybrid laser from mode-hopping due to thermal mismatch. Furthermore, by using a lookup table for the fine phase adjustment required for each channel to achieve reflector resonance alignment with the corresponding cavity mode, no active tuning control is needed for wavelength channel switching. Hence, fast wavelength switching can be achieved by turning on and off the VOAs and adjusting an EO phase tuner accordingly.

By adding a broad-band modulator 215 at laser output 214 that modulates an electrical input signal 216 to produce a modulated output 218, a tunable transmitter with fast wavelength tuning can be produced. For example, broadband modulator 215 can be implemented using an MZI modulator or an electro-optic (EO) modulator, such as a SiGe Franz-Keldish modulator.

Note that tunable laser 200 essentially comprises a hybrid laser with a single gain medium shared by multiple lasing cavities. This design will not work well using an existing demultiplexer design that uses MZI filters due to mode competition from the multiple lasing modes determined by the lattice filter. However, the VOAs 231-244 between the MZI filters 221-228 can be controlled to add additional loss to unwanted wavelength channels and to thereby select a favored wavelength channel, which is associated with only one of the narrow-band reflectors 251-258. Moreover, by using VOAs that operate through PIN current injection, this wavelength channel switching can be very fast, for example on the order of a few nanoseconds.

However, the system illustrated in FIG. 2A requires initial static tuning for each of the narrow-band reflectors 251-258 to align the reflector with its corresponding lattice filter and cavity mode. This can be problematic because in order to compensate for manufacturing variations, this initial static tuning can consume a significant amount of power, especially when many wavelength channels are required.

Figure 2B:
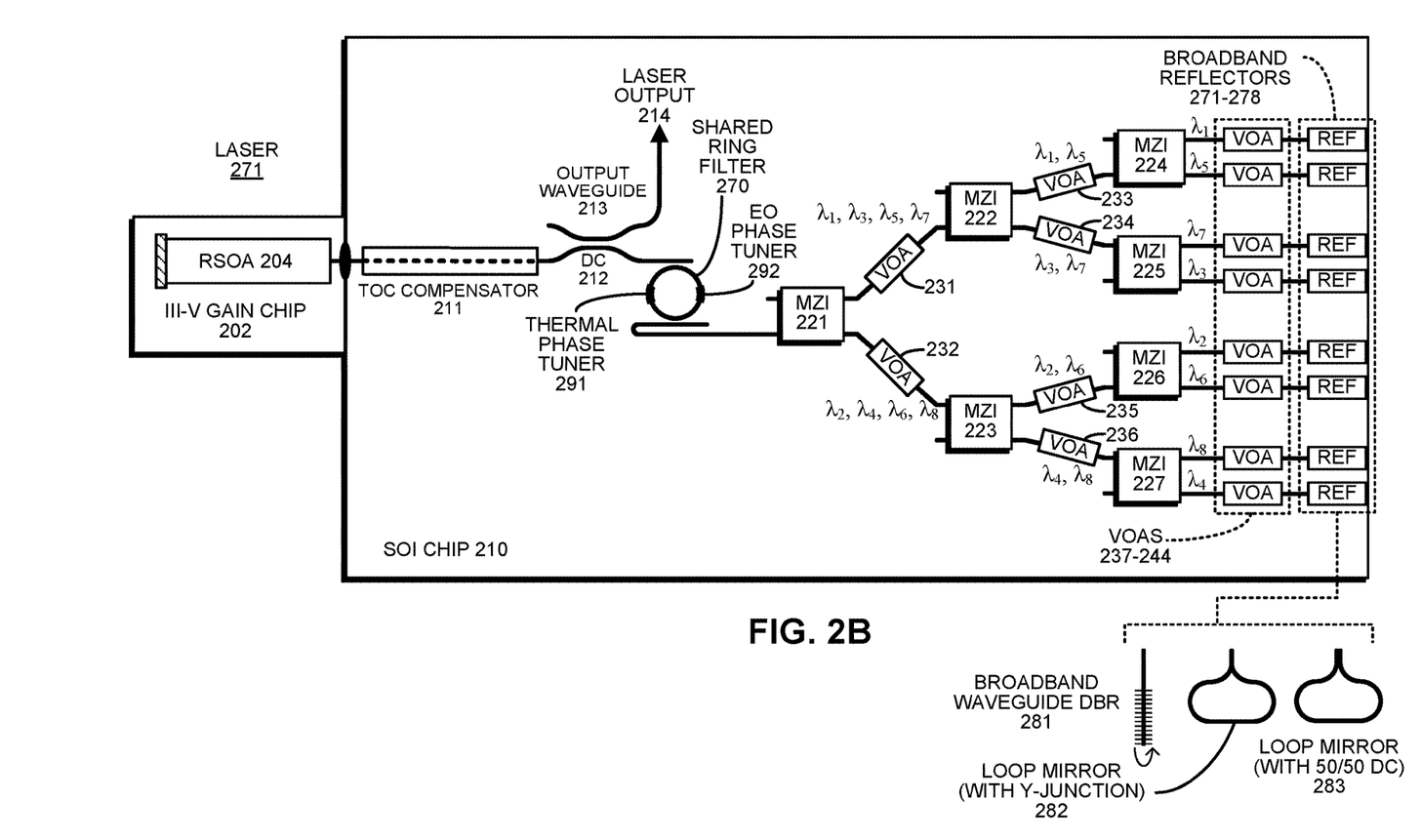
FIG. 2B illustrates a fast wavelength-tunable hybrid laser comprising a single-channel gain medium, a multi-stage lattice filter connected to broadband reflectors and a shared ring filter in accordance with the disclosed embodiments.

To overcome these problems, an alternative embodiment shown in FIG. 2B uses broadband reflectors 271-278 instead of narrow-band reflectors 251-258 at each output port of the demultiplexer, wherein the band spacing of the broadband reflectors 271-278 is designed to be the same as the laser wavelength channel spacing. As illustrated in FIG. 2B, these broadband reflectors 271-278 can be implemented using a number of different structures, including a broadband waveguide DBR 281, a loop mirror with a Y-junction 282, and a loop mirror with a 50/50 directional coupler (DC) 283.

In the embodiment of laser 271 illustrated in FIG. 2B, the input of the demultiplexer is connected to RSOA 204 through an intervening shared ring filter 270, whose FSR is also the same as the laser wavelength channel spacing. The advantage of this design over the design illustrated in FIG. 2A is that only the shared ring filter 270 needs to be tuned statically during an initial alignment operation. Moreover, a thermal phase tuner 291, which is integrated into shared ring filter 270, can be used for such tuning. Furthermore, due to cavity length uncertainty, the ring filter resonance may not be precisely aligned with the desired cavity mode of each channel. This problem can be solved by using an integrated EO phase tuner 292 (e.g., a PIN carrier injection phase tuner) to perform fine alignment of cavity modes, as long as the hybrid cavity is designed to ensure that the cavity spacing is much smaller than the FSR of the shared ring filter 270.

Although the amount of attenuation needed at the VOAs 231-244 to enable wavelength switching with desired extinction is relatively small, the total power consumption of all of the "on" VOAs can be significant if the total number of wavelength channels is large. The solution to this problem is to add higher-level VOAs 231-236 to upper lattice-filter stages. For example, for the 8-wavelength case shown in FIG. 2B, only three VOAs need to be turned "on" at any given time.

Figure 3:
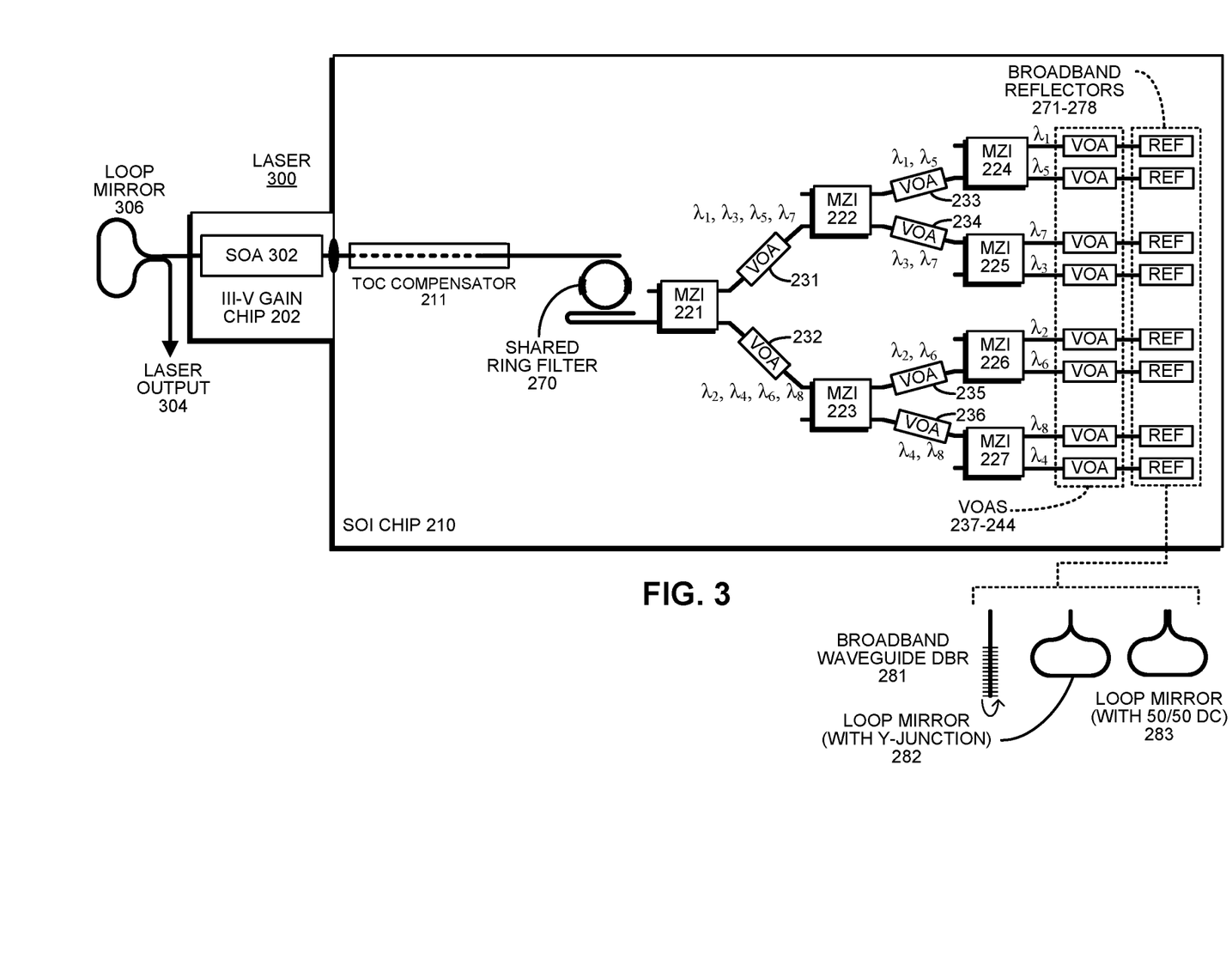
FIG. 3 illustrates another fast wavelength-tunable hybrid laser with a single-channel gain medium, a multi-stage lattice filter connected to broadband reflectors and a shared ring filter in accordance with the disclosed embodiments.

In another embodiment, a fast wavelength-tunable III-V/Si hybrid laser 300 can be built as depicted in FIG. 3. This embodiment is the same as the embodiment illustrated in FIG. 2B, except that RSOA 204 in FIG. 2B is replaced with a semiconductor optical amplifier 302, which does not includes an HR facet. Instead, a waveguide-based loop mirror 306 coupled to an end of the SOA 302 is used as the shared mirror for all of the laser cavities. Also, instead of using directional coupler (DC) 212 to produce the laser output 214 as in FIG. 2B, a directional coupler ratio associated with loop mirror 306 can be adjusted to produce a laser output 304 from a free end of loop mirror 306.

Operation

Figure 4:
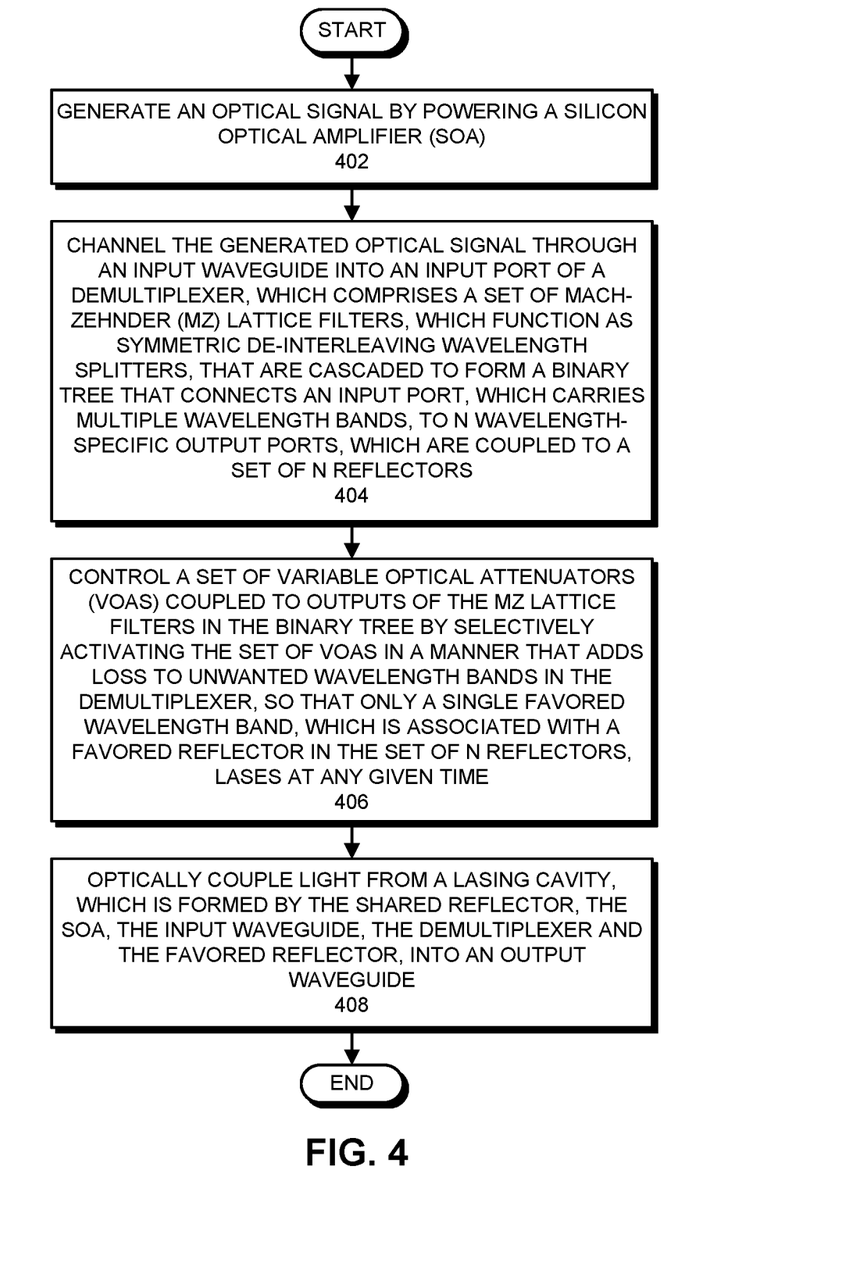
FIG. 4 illustrates a flow chart that describes the operation of a fast wavelength-tunable hybrid laser with a single-channel gain medium in accordance with the disclosed embodiments.

During operation, the tunable laser system described above operates as illustrated in the flow chart that appears in FIG. 4. First, the system generates an optical signal by powering a semiconductor optical amplifier (SOA) (step 402). Next, the system channels the generated optical signal through an input waveguide into an input port of a demultiplexer, which comprises a set of Mach-Zehnder (MZ) lattice filters, which function as symmetric de-interleaving wavelength splitters, that are cascaded to form a binary tree that connects an input port, which carries multiple wavelength bands, to N wavelength-specific output ports, which are coupled to a set of N reflectors (step 404). The system then controls a set of variable optical attenuators (VOAs) coupled to outputs of the MZ lattice filters in the binary tree to selectively activate the set of VOAs in a manner that adds loss to unwanted wavelength bands in the demultiplexer, so that only a single favored wavelength band, which is associated with a favored reflector in the set of N reflectors, lases at any given time (step 406). Finally, the system optically couples light from a lasing cavity, which is formed by the shared reflector, the SOA, the input waveguide, the demultiplexer and the favored reflector, into an output waveguide (step 408).

System

Figure 5:
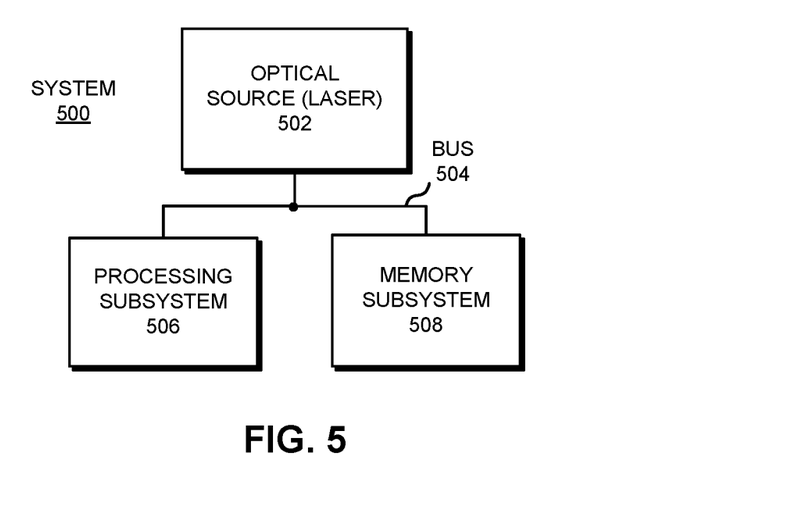
FIG. 5 illustrates a system that includes an optical source, such as a laser, in accordance with an embodiment of the present disclosure.

One or more of the preceding embodiments of the tunable laser may be included in a system or device. More specifically, FIG. 5 illustrates a system 500 that includes an optical source 502, such as a tunable laser. System 500 also includes a processing subsystem 506 (with one or more processors) and a memory subsystem 508 (with memory).

In general, components within optical source 502 and system 500 may be implemented using a combination of hardware and/or software. Thus, system 500 may include one or more program modules or sets of instructions stored in a memory subsystem 508 (such as DRAM or another type of volatile or non-volatile computer-readable memory), which, during operation, may be executed by processing subsystem 506. Furthermore, instructions in the various modules in memory subsystem 508 may be implemented in: a high-level procedural language, an object-oriented programming language, and/or in an assembly or machine language. Note that the programming language may be compiled or interpreted, e.g., configurable or configured, to be executed by the processing subsystem.

Components in system 500 may be coupled by signal lines, links or buses, for example bus 504. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 500 may be at one location or may be distributed over multiple, geographically dispersed locations.

System 500 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical source 502 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A tunable laser, comprising:
   a gain medium having a reflective end coupled to a shared reflector and an output end;
   a demultiplexer comprising a set of wavelength splitters that are cascaded to form a binary tree that connects an input port, which carries multiple wavelength bands, to N wavelength-specific output ports;
   an input waveguide, which couples the output end of the gain medium to the input port of the demultiplexer;
   a set of N reflectors coupled to the N output ports of the demultiplexer;
   a set of variable optical attenuators (VOAs) coupled to outputs of the wavelength filters in the binary tree, which are controllable to selectively add loss to the outputs;
   a controller that selectively activates the set of VOAs to add loss to unwanted wavelength bands in the demultiplexer, so that only a single favored wavelength band, which is associated with a favored reflector in the set of N reflectors, lases at any given time; and
   an output waveguide, which is optically coupled to a lasing cavity formed by the shared reflector, the gain medium, the input waveguide, the demultiplexer and the favored reflector.

2. The tunable laser of claim 1, wherein the demultiplexer is a symmetric de-interleaving wavelength splitter.

3. The tunable laser of claim 2, wherein the symmetric de-interleaving wavelength splitter is a Mach-Zehnder (MZ)-lattice-based demultiplexer, wherein the wavelength splitters are MZ lattice filters.

4. The tunable laser of claim 1, wherein the set of N reflectors comprises wavelength-specific narrow-band reflectors.

5. The tunable laser of claim 4, wherein the wavelength-specific narrow-band reflectors comprise one of the following:
   narrow-band waveguide distributed Bragg reflectors (DBRs);
   ring reflectors; and
   ring reflectors coupled with loop mirrors.

6. The tunable laser of claim 1,
   wherein the set of N reflectors comprises broadband reflectors; and
   wherein the input waveguide is optically coupled to the input port of the demultiplexer through an intervening shared ring filter, wherein the shared ring filter has a free spectral range (FSR) that matches a specified wavelength channel spacing.

7. The tunable laser of claim 6, wherein the broadband reflectors comprise one of the following:
   broadband waveguide DBRs;
   loop mirrors with Y-junctions; and
   loop mirrors with directional couplers.

8. The tunable laser of claim 6, wherein the shared ring reflector includes:
   a thermal phase tuner to facilitate an initial alignment with a cavity mode; and
   an electro-optical (EO) phase tuner to facilitate subsequent fine alignment with the cavity mode.

9. The tunable laser of claim 1, wherein the input waveguide includes a thermo-optic coefficient (TOC) compensator comprising a section of compensation material;
   wherein the lasing cavity includes a length $l_{Si}$ through silicon, a length $l_C$ through the compensation material, and a length $l_{OGM}$ through the optical gain material;
   wherein the effective refractive index of silicon is $n_{Si}$, the effective refractive index of the compensation material is $n_C$, and the effective refractive index of the optical gain material is $n_{OGM}$;
   wherein the effective TOC of silicon is $dn_{Si}/dT$, the effective TOC of the compensation material is $dn_C/dT$, and the effective TOC of the optical gain material is $dn_{OGM}/dT$; and
   wherein $lc \approx l_{OGM}*(dn_{OGM}/dT - dn_{Si}/dT)/(dn_{Si}/dT - dn_C/dT)$, whereby the effective TOC of a portion of the lasing cavity that passes through the optical gain material and the compensation material is substantially the same as the TOC of silicon.

10. The tunable laser of claim 1, wherein the gain medium comprises a reflective semiconductor optical amplifier (RSOA), and wherein the shared reflector comprises a reflective facet of the RSOA.

11. The tunable laser of claim 10, wherein the reflective facet of the RSOA is partially reflective, and wherein unreflected light from the reflective facet feeds into the output waveguide.

12. The tunable laser of claim 1, wherein the shared reflector comprises a waveguide loop mirror with a first end coupled to the reflective end of the gain medium.

13. The tunable laser of claim 12, wherein a second end of the waveguide loop mirror is coupled to the output waveguide.

14. The tunable laser of claim 1, wherein the output waveguide is optically coupled to the input waveguide through a directional coupler.

15. The tunable laser of claim 1, wherein the gain medium is located on a gain chip, which is separate from a semiconductor chip that includes the input waveguide, the demultiplexer, the set of N reflectors and the set of VOAs.

16. A system, comprising:
   at least one processor;
   at least one memory coupled to the at least one processor; and
   an optical transmitter for communicating optical signals generated by the system, wherein the optical transmitter includes a tunable laser comprising:
      a gain medium having a reflective end coupled to a shared reflector and an output end;
      a demultiplexer comprising a set of wavelength splitters that are cascaded to form a binary tree that connects an input port, which carries multiple wavelength bands, to N wavelength-specific output ports;
      an input waveguide, which couples the output end of the gain medium to the input port of the demultiplexer;

a set of N reflectors coupled to the N output ports of the demultiplexer;
a set of variable optical attenuators (VOAs) coupled to outputs of the wavelength filters in the binary tree, which are controllable to selectively add loss to the outputs;
a controller that selectively activates the set of VOAs to add loss to unwanted wavelength bands in the demultiplexer, so that only a single favored wavelength band, which is associated with a favored reflector in the set of N reflectors, lases at any given time; and
an output waveguide, which is optically coupled to a lasing cavity formed by the shared reflector, the gain medium, the input waveguide, the demultiplexer and the favored reflector.

17. The system of claim 16, wherein the set of N reflectors comprises wavelength-specific narrow-band reflectors.

18. The system of claim 16,
wherein the set of N reflectors comprises broadband reflectors; and
wherein the input waveguide is optically coupled to the input port of the demultiplexer through an intervening shared ring filter, wherein the shared ring filter has a free spectral range (FSR) that matches a specified wavelength channel spacing.

19. The system of claim 16, wherein the input waveguide includes a thermo-optic coefficient (TOC) compensator comprising a section of compensation material;
wherein the lasing cavity includes a length $l_{Si}$ through silicon, a length $l_C$ through the compensation material, and a length $l_{OGM}$ through the optical gain material;
wherein the effective refractive index of silicon is $n_{Si}$, the effective refractive index of the compensation material is $n_C$, and the effective refractive index of the optical gain material is $n_{OGM}$;
wherein the effective TOC of silicon is $dn_{Si}/dT$, the effective TOC of the compensation material is $dn_C/dT$, and the effective TOC of the optical gain material is $dn_{OGM}/dT$; and
wherein $lc \approx l_{OGM}*(dn_{OGM}/dT - dn_{Si}/dT)/(dn_{Si}/dT - dn_C/dT)$, whereby the effective TOC of a portion of the lasing cavity that passes through the optical gain material and the compensation material is substantially the same as the TOC of silicon.

20. A method for operating a tunable laser, comprising:
generating an optical signal by powering a gain medium having a reflective end coupled to a shared reflector;
channeling the generated optical signal through an input waveguide into an input port of a demultiplexer that comprises a set of wavelength splitters that are cascaded to form a binary tree that connects an input port, which carries multiple wavelength bands, to N wavelength-specific output ports, which are coupled to a set of N reflectors;
controlling a set of variable optical attenuators (VOAs) coupled to outputs of the wavelength filters in the binary tree, which are controllable to selectively add loss to the outputs, wherein controlling the set of VOAs involves selectively activating the set of VOAs to add loss to unwanted wavelength bands in the demultiplexer, so that only a single favored wavelength band, which is associated with a favored reflector in the set of N reflectors, lases at any given time; and
optically coupling light from a lasing cavity, which is formed by the shared reflector, the gain medium, the input waveguide, the demultiplexer and the favored reflector, into an output waveguide.

* * * * *

UNITED STATES PATENT AND TRADEMARK OFFICE
CERTIFICATE OF CORRECTION

PATENT NO. : 9,780,528 B1
APPLICATION NO. : 15/357418
DATED : October 3, 2017
INVENTOR(S) : Xuezhe Zheng et al.

Page 1 of 1

It is certified that error appears in the above-identified patent and that said Letters Patent is hereby corrected as shown below:

In the Drawings

Sheet 2 of 6, at 261 FIG. 2A, please delete, "NARRROW-BAND", and replace with --NARROW-BAND--

In the Specification

Column 3, Line 5, please delete, "waveguide", and replace with --reflector--

Column 6, Line 40-41, please delete, "Franz-Keldish", and replace with --Franz Keldysh--

Signed and Sealed this
Twentieth Day of November, 2018

Andrei Iancu
*Director of the United States Patent and Trademark Office*